United States Patent
Yamauchi

(10) Patent No.: US 7,107,513 B1
(45) Date of Patent: Sep. 12, 2006

(54) METHOD AND APPARATUS FOR DECODING RECEIVED DATA IN A COMMUNICATIONS SYSTEM

(75) Inventor: Ken Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 09/634,637

(22) Filed: Aug. 8, 2000

(30) Foreign Application Priority Data

Sep. 13, 1999 (JP) .................................. 11-259315

(51) Int. Cl.
*H03M 13/03* (2006.01)
(52) U.S. Cl. ........................................ 714/795; 714/796
(58) Field of Classification Search ................ 714/704, 714/774, 795, 796, 746, 752, 786; 375/94, 375/265

See application file for complete search history.

(56) References Cited

U.S. PATENT DOCUMENTS 5,363,413 A * 11/1994 Vos .............................. 375/340
5,771,467 A *  6/1998 Sato ............................. 455/557
5,949,832 A *  9/1999 Liebetreu et al. .......... 375/344

FOREIGN PATENT DOCUMENTS

JP            9-247003           9/1997

* cited by examiner

*Primary Examiner*—Guy Lamarre
*Assistant Examiner*—Mujtaba K. Chaudry
(74) *Attorney, Agent, or Firm*—Arent Fox PLLC

(57) ABSTRACT

A plurality of data streams, which are coded by a convolution code and where coding rates and modulation systems are set respectively, and multiplexed in time division so that multiplex data are composed. A signal-to-noise ratio monitor measures the strength of the noise included in the multiplex data. A comparator outputs a post signal when a comparison indicates that the measured noise strength is equal to greater than a preset value. A multiplex control signal generator inputs an initialization signal into a Viterbi decoder at a timing at which decoding of individual data streams is started based on the received post signal. The Viterbi decoder initializes the calculated path metric upon receipt of the initialization signal.

29 Claims, 12 Drawing Sheets

_US 7,107,513 B1_

METHOD AND APPARATUS FOR DECODING RECEIVED DATA IN A COMMUNICATIONS SYSTEM

FIELD OF THE INVENTION

The present invention relates to a technology of demodulating a received digital-modulated signal and decoding actual data from digital data obtained by the demodulation. More particularly, the invention relates to a decoding method, a decoder, a data receiving system, and a data transmission and receiving system which decodes a data stream, which is coded by using a convolutional code and is multiplexed in time division, using Viterbi decoding.

BACKGROUND OF THE INVENTION

Recently, as integrated circuits and coding techniques, which can process digital data at a high speed, are becoming available. Therefore, analog-system techniques are now replaced by such digital techniques. Particularly, growth television broadcasting service, satellite broadcasting service and the like are being converted to digital broadcasting.

The digital satellite broadcasting adopts a radio communication system in which a carrier signal is transmitted via an artificial satellite and is received directly by a receiver installed in a house or the like. However, since this digital satellite broadcasting utilizes the atmosphere as a transmission space, it is easily influenced by weather and the other factors. When the weather is bad the reception becomes worse. As a result, in a transmitter and a receiver which are terminal sections of the digital satellite broadcasting system, the transmission/receiving process with high stability and high reliability is required in comparison with the conventional cable and ground wave television service.

In radio communication of a digital-modulated signal like the digital satellite broadcasting, digital data to be digital-modulated are composed of bit strings (data stream) which undergo a so-called coding process in which redundancy is added to actual data so that the stability and reliability of the transmission/receiving process is heightened.

As the redundancy of the data stream is higher, error correction ability of the data stream is improved further in the decoding process in the receiver. In other words, even if the data stream with high redundancy include a lot of error bits upon receiving, the error bits can be corrected and the data stream can be reproduced correctly upon transmission. Meanwhile, such data stream with high redundancy has a disadvantage that a number of structure bits increases and transmission efficiency is lowered.

When image or sound information is received as data stream including a little error, for example, the information as a whole can be accepted. Therefore, the redundant may be comparatively lowered and the transmission efficiency heightened so that a lot of information can be transmitted. On the other hand, for a data stream which represents computer programs where even one bit error is not allowed, generally the redundancy is set to comparatively higher value because upon receiving the information is required to be securely restored.

FIG. 1 is a block diagram showing a schematic structure of a conventional transmitter and particularly shows a portion of the transmitter used in digital satellite broadcasting. This transmitter is composed of a coder 100 and a modulator 150. The coder 100 multiplexes and codes data from a plurality of information sources 1, 2, . . . , n. The modulator 150 modulates the coded signals according to a predetermined modulation system. The information sources here are digital data strings (transport stream) which are compressed by MPEG2 (Motion Picture Expert Group 2) as one of the motion picture compressing systems.

Further, the coder 100 is composed of a multiplexer 110, a convolution coder 120, a punctured module 130 and a multiplex control signal generator 140. Although not shown in the figure, the multiplexer 110 is composed of, for example, a Reed-Solomon coding circuit, a frame structure circuit, an energy dispersion circuit and an interleaver and multiplexes and codes the input information sources. Operation of the transmitter is explained below.

The multiplex control signal generator 140 generates a multiplex control signal which represents multiplexed information of the information sources. The multiplexed information is the information which represents positions (timing) of information source data multiplexed on one carrier and transmission systems (redundancy, modulation systems, etc).

The information sources are input into the Reed-Solomon coding circuit of the multiplexer 110. The Reed-Solomon coding circuit adds a Reed-Solomon code which, can correct an error of a byte unit in the receiver based on the multiplex information represented by the multiplex control signal output from the multiplex control signal generator 140, to the bit strings of the information sources so as to output the coded strings of the respective information sources.

The code strings output from the Reed-Solomon coding circuit are input into the frame structure circuit. The frame structure circuit multiplexes the code strings based on the multiplex information represented by the multiplex control signal output from the multiplex control signal generator 140 so as to structure a frame to be a unit of the multiplexed data.

A signal output in the frame unit from the frame structure circuit is input into the energy dispersion circuit. The energy dispersion circuit adds (scramble) a pseudo random signal (energy dispersion signal) to the digital data. As a result, the digital data composing the input frames, namely, bit strings are not transmitted as enumeration of bit "0" or bit "1" for long period.

The aim is to prevent misconception of reception such as error detection or non-detection of a digital signal on the receiving side due to reception of the long-period continuous same bits. The pseudo random signal should be removed on the receiving side. For this reason, also in the energy dispersion circuit, a position of the digital data, where information representing a generating condition of the pseudo random signal such as a random initial value and the like is shown, is determined by referring to the multiplex information.

The signal scrambled in the energy dispersion circuit is input into the interleaver. The interleaver rearranges the digital data represented by the input signal in byte unit so as to improve resistance to a burst error (long-period continuous error) appearing intensively in time.

As a result, even if burst errors occur in the rearranged digital signals, the errors which occur intensively can be dispersed because the process for restoring the rearrangement of the digital signals (the process by the interleaver) is executed on the receiving side. As a result, improvement of the error correction and a correct recognition rate of the transmitted information can be heightened. The information about the rearrangement can be obtained also from multiplex information.

The signals arranged by the interleaver are the outputs of the multiplexer 110 and are input into the convolution coder 120. The convolution coder 120 executes the convolution coding process with respect to the input signals. As a result, random errors such as errors of irregular bit units such as a thermal noise which are generated in a transmission line or the receiver can be corrected.

FIG. 2 is a block diagram showing a schematic structure of the convolution coder 120. The convolution coder 120 is composed of a shift register comprising D latches 121 and 122, two EXOR circuits 124 and 125, and a parallel-serial converter 128. The convolution coder 120 executes the coding in such a manner that one-bit input data are output as 2-bit data. When the coding rate is defined as (Original information content)/(coded information content), the coding rate in the convolution coder 120 is 1/2.

In the convolution coder 120 shown in FIG. 2, two-bit serial data are held by the D latches 121 and 122 in the order of input. Three-bit serial data are converted into parallel data by the two-bit data and one-bit data further input. Newly input data and the data held in the D latches 121 and 122 are input into the EXOR circuit 124 so as to undergo exclusive OR. Moreover, the newly input data and the data held in the D latch 122 are input into the EXOR circuit 125 so as to undergo exclusive OR.

The calculated results of the two exclusive OR are again converted into serial data in the parallel-serial converter 128. As a result, three-bit input serial data are output as six-bit serial data, for example, and this output result becomes a convolution code.

In order to improve the transmission efficiency, four-bit data, which are obtained by thinning out two bits from six-bit data output from the convolution coder 120, are used as output data. In this method, the coding rate is 3/4, and in comparison with the coding rate 1/2 in the case of the convolution coder 120, redundancy can be made lower and the transmission efficiency can be heightened.

Furthermore, this method simultaneously reduces the error correction ability. As a result, the redundancy can be controlled by changing a degree of the thinning-out of data. This data thinning-out process is called as puncturing. The punctured module 130 shown in FIG. 1 executes such puncturing.

FIG. 3 is an explanatory diagram showing an example of the coding rate obtained by puncturing. FIG. 3 shows puncturing of the coding rates 2/3, 3/4, 5/6 and 7/8 which is generated by thinning out a convolution code of the coding rate 1/2. Explanation is provided below for the puncturing of the coding rate 3/4.

It is assumed that data "x0, y0, x1, y1, x2, y2" are obtained from data constituted by "d0, d1, d2" by the convolution coder 120. In such a case, the punctured module 130 deletes a bit in a position corresponding to "0" with reference to a previously prepared bit deletion map "1, 1, 0, 1, 1, 0". Undeleted bit after the deleted one is shifted to the position of the deleted bit. In other wards, this bit deletion map shows that two bits are thinned out from six bits. As a result, only four-bit data of "x0, y0, y1, x2" are output.

Thus, the punctured module 130 enables changes of various kinds in the coding rates as shown in FIG. 3. When a various kinds of bit deletion maps are prepared, the transmission efficiency can be selected according to a signal transmission line or a signal characteristic.

The code strings output from the punctured module 130 in such a manner become a data stream which is obtained by coding and multiplexing data of a plurality of information sources with the coding rates determined in the respective information source. The data stream is output from the coder 100. The data stream is input into the modulator 150 shown in FIG. 1 and is digital-modulated according to a modulation system which is suitable to the carrier so as to be output as a transmission signal.

As the digital modulation executed in the modulator 150, modulations like amplitude modulation (ASK), frequency modulation (FSK), phase modulation (PSK) may be considered. An explanation is provided below for the digital phase modulation.

The digital phase modulation is a system where the bit structures composed of "0" or "1" of the digital data are made to have correspondence to phases, and the phases are changed for the carrier so that information is transmitted. The digital phase modulation system further includes BPSK, QPSK (or 4PSK), 8PSK and the like according to a number of phases to be used.

As for the transmission signal which is digital-phase modulated, one phase state (transmission symbol) of the carrier is checked in the receiver so that one-bit information can be transmitted in BPSK and two-bit information in QPSK and three-bit information in 8PSK. This shows that the transmission efficiency varies with the respective phase modulation systems. However, as the transmission efficiency becomes higher, adjacent transmission symbols are closer to each other so that clear distinction between the phases becomes difficult. As a result, error can be easily generated in the information. For this reason, the phase modulation using these three systems is selected according to a characteristic of information to be transmitted.

In other words, as for the data of the information sources multiplexed as the data stream, in addition to the selection of the coding rates by means of the coder 100, the modulation system by means of the modulator 150 can be selected.

FIG. 4 is an explanatory diagram showing a structure of the data stream output from the coder 100. The data stream shown in FIG. 4 is generated by the frame structure circuit. A data stream 1, a data stream 2, and a data stream 3 which represent three information source data are multiplexed and arranged in a frame identified by a synchronous code. For example, the data stream 1, the data stream 2, and the data stream 3 can be allocated in this order to a QPSK modulation stream of the coding rate 3/4, a QPSK modulation stream of the coding rate 1/2 and a BPSK modulation stream of the coding rate 1/2.

In addition, some frames can be processed as one collective information (hereinafter, referred to as "super frame"). In this case, in the super frame composed of eight frames, for example, the synchronous code is arranged at the head of each frame, and a parity signal corresponding to the Reed-Solomon code is arranged in the last two frames so that the error correction ability is heightened.

An explanation is provided below for a conventional receiver which receives a transmission signal transmitted from the transmitter and demodulates and decodes the signal. FIG. 5 is a block diagram showing a schematic structure of such a conventional receiver. FIG. 5 shows one example of the receiver of the digital satellite broadcasting which is suitable to the transmitter in FIG. 1. This receiver is composed of a demodulator 190 further having a digital phase modulation circuit and a decoder 200.

The decoder 200 is composed of a depuncture module 210, a Viterbi decoder 220, a synchronizer 230, a data stream decoder 240, a multiplex control signal generator 250, and a multiplex information storage section 260. The data stream decoder 240 is composed of, for example, a deinterleaver, an energy dispersion signal removal circuit and a Reed-Solomon code error correcting circuit correspondingly to the similar structure in the multiplexer 110 shown in FIG. 1. The data stream decoder 240 decodes the multiplexed data stream. Operation of this receiver is explained below.

Similarly to the multiplex control signal generator 140 shown in FIG. 1, a multiplex control signal is generated in the multiplex control signal generator 250 of the decoder 200. Multiplex information represented by the multiplex control signal is previously stored in the multiplex information storage section 260. The multiplex control signal generator 250 generates a multiplex control signal based on the multiplex information.

The demodulator 190 demodulates the received signal in accordance with acquisition timing of the information source data represented by the multiplex control signal and the modulation system. Precisely, the demodulator 190 extracts a code string in the state before the received signal is modulated in the modulator 150 of the transmitter, and digital phase demodulation is executed in this example.

The signal demodulated by the demodulator 190 is input into the depuncture module 210 of the decoder 200. The depuncture module 210 inserts the bit which is deleted in the punctured module 130 into the input signal based on the coding rate represented by the multiplex control signal (depuncturing).

The code string which is depunctured by the depuncture module 210 is input into the Viterbi decoder 220 so that the convolutional code coded in the convolution coder 120 of the transmitter is decoded. That is, the Viterbi decoder 220 calculates a Hamming distance between the code represented by the input code string and a code on a trellis chart as path metric and leaves path metric of short Hamming distance as survival path. Further, the Viterbi decoder 220 decodes a code string corresponding to a path metric of the shortest Hamming distance as a maximum code.

The code string decoded by the Viterbi decoder 220 is input into the synchronizer 230. The synchronizer 230 detects a synchronous code in the frame shown in FIG. 4 from the data stream and generates a control signal for acquiring the decoding timing of the multiplexed code strings.

FIG. 6 is a block diagram showing a schematic structure of the synchronizer 230. As shown in FIG. 6, the received code string is input into a sync word detection circuit 231 and a buffer 235. The sync word detection circuit 231 detects the synchronous code from the input code string and generates a detection signal. The synchronous acquisition control circuit 232 outputs a signal representing synchronous timing according to the received the detection signal and a predetermined synchronous clock.

A control signal generation circuit 233 inputs the signal output from the synchronous acquisition control circuit 232 so as to output a control signal representing that current time is positioned at the head of the frame. Meanwhile, the code string input into the buffer 235 is delayed until output of the control signal is completed so as to be output as data stream at predetermined timing. The control signal output from the synchronizer 230 is input into the multiplex control signal generator 250 shown in FIG. 5 so as to be utilized for obtaining output timing of the multiplex control signal.

The data stream output from the synchronizer 230 is input into the data stream decoder 240. The data stream then undergoes the decoding processes corresponding to the coding processes in the interleaver, the energy dispersion circuit and the Reed-Solomon coding circuit composing the multiplexer 110 shown in FIG. 1.

The decoded data bit string output from the data stream decoder 240 becomes an output of the decoder 200 and is input into a not shown MPEG reproduction apparatus or the like, which is connected in the later stage. This MPEG reproduction apparatus extracts corresponding data from the data bit string by selecting an information source, and displays the extracted data as a motion picture.

However, as mentioned above, the transmission-reception system composed of the convolution coder 120 and the Viterbi decoder 220, coding and decoding are executed by the calculation methods based on superposing of past bit strings continuously transmitted. For this reason, a data stream having coding rate of high error correction ability is influenced by the case that error cannot be corrected in a data stream having coding rate of low error correction ability. As a result, the whole error correction ability of the multiplexed data stream is lowered.

For example, consider a case in which two or more kinds of coding rates are used between the data streams composing the multiplexed data stream, and comparatively big noise is mixed on the transmission line. In this case, although error can be sufficiently corrected in the data stream having coding rate of high error correction ability in the multiplexed data streams, error is still included in a decoded result of the data stream having coding rate of low error correction ability. In this state, the Viterbi decoder decodes the data stream having coding rate of high error correction ability which is next input continuously according to calculation of path metric using the data stream including the error. For this reason, the data stream having coding rate of high error correction ability cannot be decoded correctly.

In order to solve such a problem, Japanese Patent Application Laid-Open No. 9-247003 discloses "information receiver". This information receiver inserts a known "end bit" into a plurality of multiplexed data streams by means of the convolution coder just before the coding rate changes. The Viterbi decoder initializes path metric at timing that the "end bit" is detected.

As a result, in the state that the path metric is initialized per data stream, namely in the state that a storage device of a Hamming distance calculated in the Viterbi decoder is initialized, Viterbi decoding can be started. This prevents the data streams having different coding rates from being influenced by the decoding.

However, the "information receiver" cannot solve the above problem when the "end bit" cannot be inserted into the data streams from the viewpoint of the standard of data transmission in digital satellite broadcasting or the like. If the "end bit" is not inserted and not detected and the path metric is initialized at a change point of the coding rate, namely, a point that transmission of next data stream is started, there arises a new problem that a convolutional code fails and the error correction ability is lowered.

For example, in a data stream which is obtained by multiplexing a code of low error correction ability and a code of high error correction ability, an error of a code having low error correction ability which can be corrected sufficiently occurs on a transmission line. In this case, when the path metric is initialized at the change point of the data stream, a vicinity of the head of the data stream cannot be decoded. As a result, more errors occur than the case that the initialization is not executed.

SUMMARY OF THE INVENTION

It is an object of the invention to initialize path metric in a Viterbi decoder according to strength of a noise on a transmission line and coding rates of continuous data streams so as to optimally decode a plurality of data stream, which are multiplexed without inserting an "end bit" thereinto, with high stability and reliability.

In order to solve the above problem and achieve the above object, in a decoding method and a decoder of the present invention a signal-to-noise ratio monitor measures the strength of the noise included in the multiplex data, and a comparison unit outputs a post signal when the measured noise strength is equal to or greater than a preset value, and an initialization signal generation unit inputs an initialization signal into the Viterbi decoder at timing that decoding of the data streams is started according to the receipt of the post signal so that calculated path metric is initialized.

Thus, only when the noise which exceeds a predetermined value is detected by the signal-to-noise ratio monitor, the path metric of the Viterbi decoder is initialized. For this reason, only in the case where a noise where an initializing effect can be obtained even after adding deterioration of the decoding characteristic due to the initialization occurs, the initialization is possible.

Further, a signal selection unit initializes path metric of the Viterbi decoder only when a coding rate of a data stream to be decode is larger than a coding rate of a data stream which has just been decoded.

Thus, only when the timing that the initialization signal is input is the point that the data stream having coding rate of low error correction ability is changed into the data stream having coding rate of high error correction ability, the Viterbi decoder is initialized. For this reason, the calculated result of the path metric calculated by decoding the data stream having coding rate of high error correction ability can be utilized when the next data stream having coding rate of low error correction ability is decoded.

Other objects and features of this invention will become apparent from the following description with reference to the accompanying drawings.

DESCRIPTION OF THE PREFERRED EMBODIMENTS

Preferred embodiments of a decoding method and a decoder of the present invention are explained below with reference to the attached drawings. However, this invention is not limited to these embodiments.

A decoding method and a decoder according to a first embodiment is explained here. The decoding method and the decoder according to the first embodiment have the following characteristic in addition to the characteristic of the conventional decoder 200. Precisely, noise strength of a signal output from the demodulator 190 is measured and when the measured noise strength exceeds a predetermined value only then an initialization signal which instructs initialization of path metric is input into the Viterbi decoder 220 via the multiplex control signal generator 250. As a result, decoding can be executed optimally in accordance with the strength of the noise mixed on the transmission line.

Figure 7:
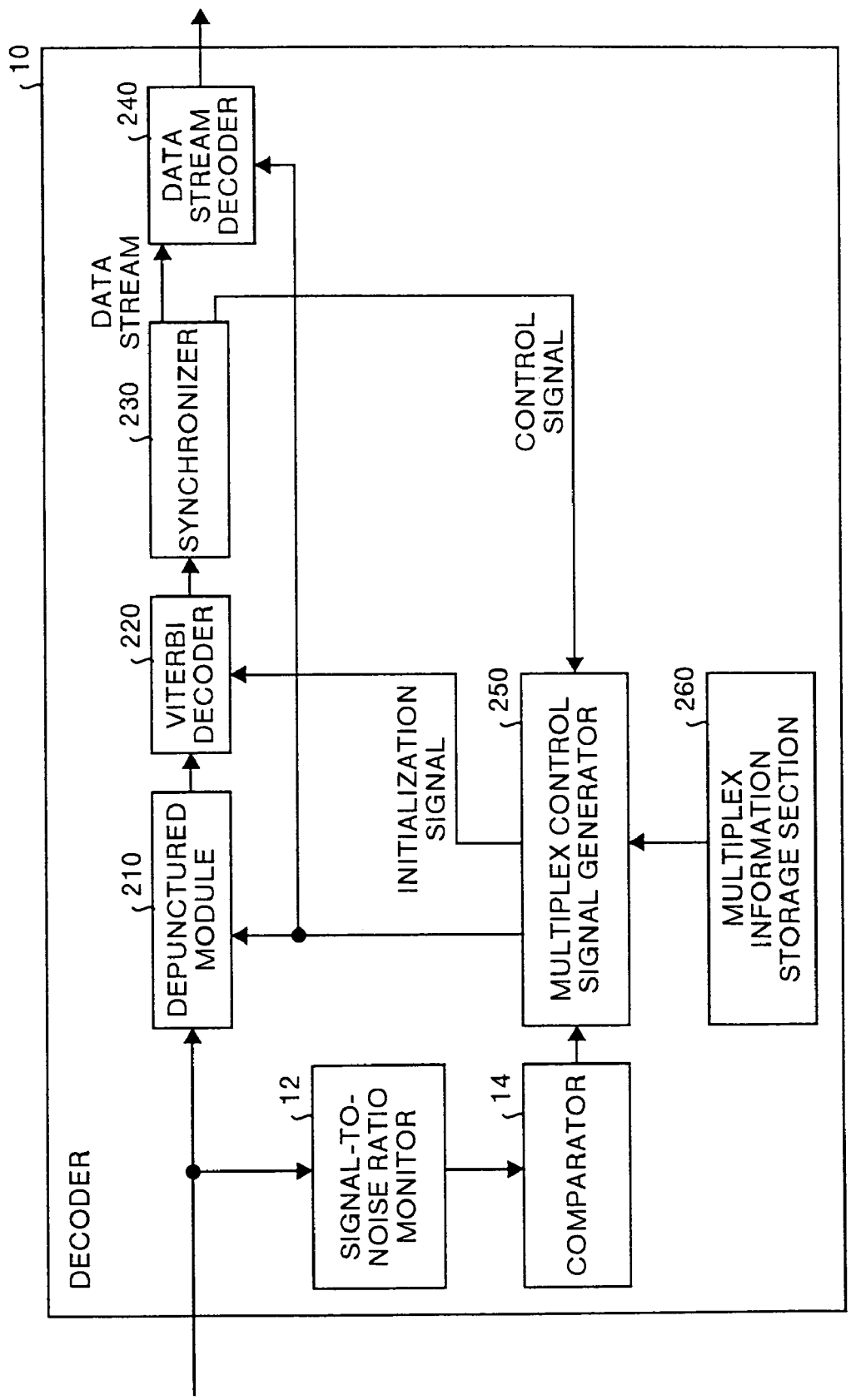
FIG. 7 is a block diagram showing a schematic structure of a decoder according to a first embodiment.

FIG. 7 is a block diagram showing a schematic structure of the decoder according to the first embodiment. The decoder 10 shown in FIG. 7 is provided with a signal-to-noise ratio monitor 12 and a comparator 14. The signal-to-noise ratio monitor 12 measures strength of noise from a signal input into the depuncture module 210 so as to digitize the measured noise strength. The comparator 14 compares the output of the signal-to-noise ratio monitor 12 with a predetermined value and outputs a signal representing the result of comparison (hereinafter, referred to as a post signal). The multiplex control signal generator 250 outputs an initialization signal to the Viterbi decoder 220 based on the post signal received from the comparator 14. This process is different from the one executed in the conventional decoder 200.

Figure 1:
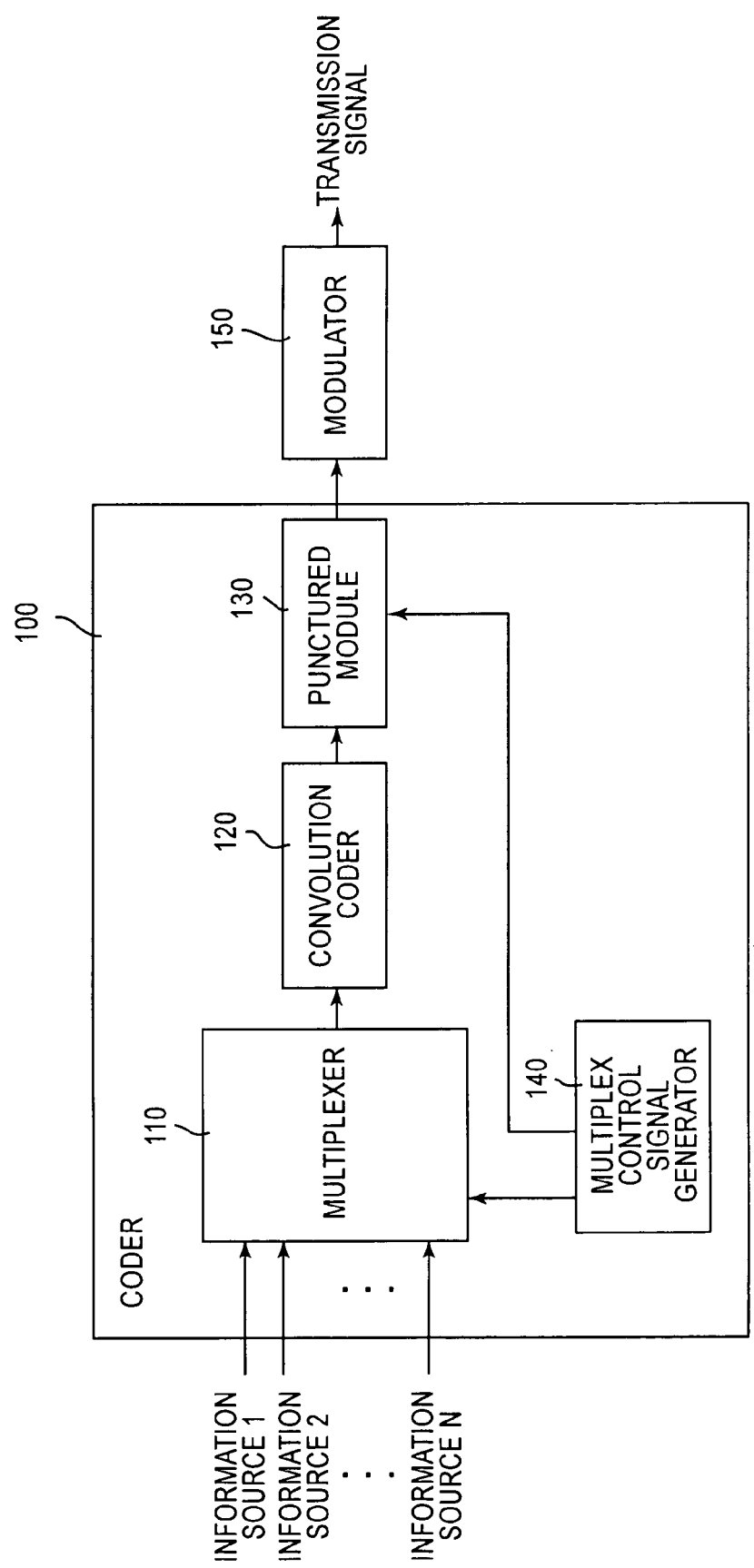
FIG. 1 is a block diagram showing a schematic structure of a conventional transmitter.
Figure 2:
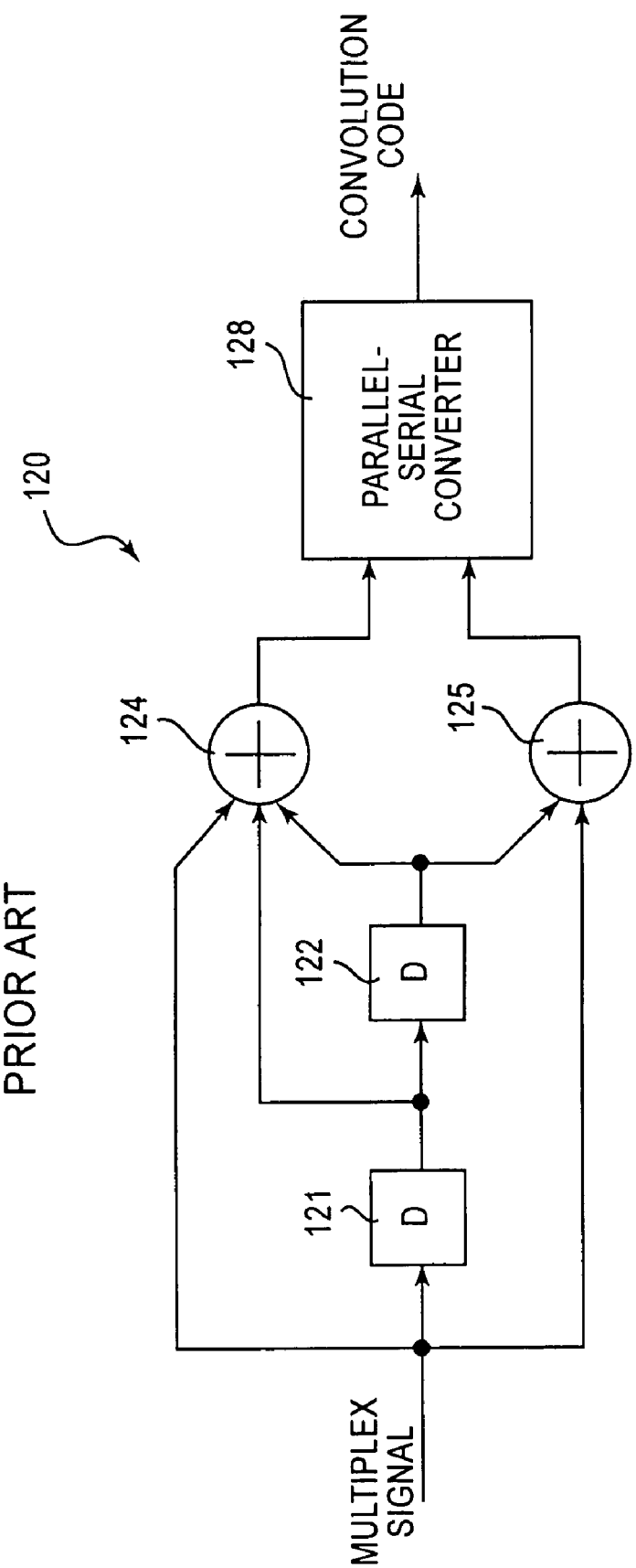
FIG. 2 is a block diagram showing a schematic structure of a convolution coder in the conventional transmitter.
Figure 3:
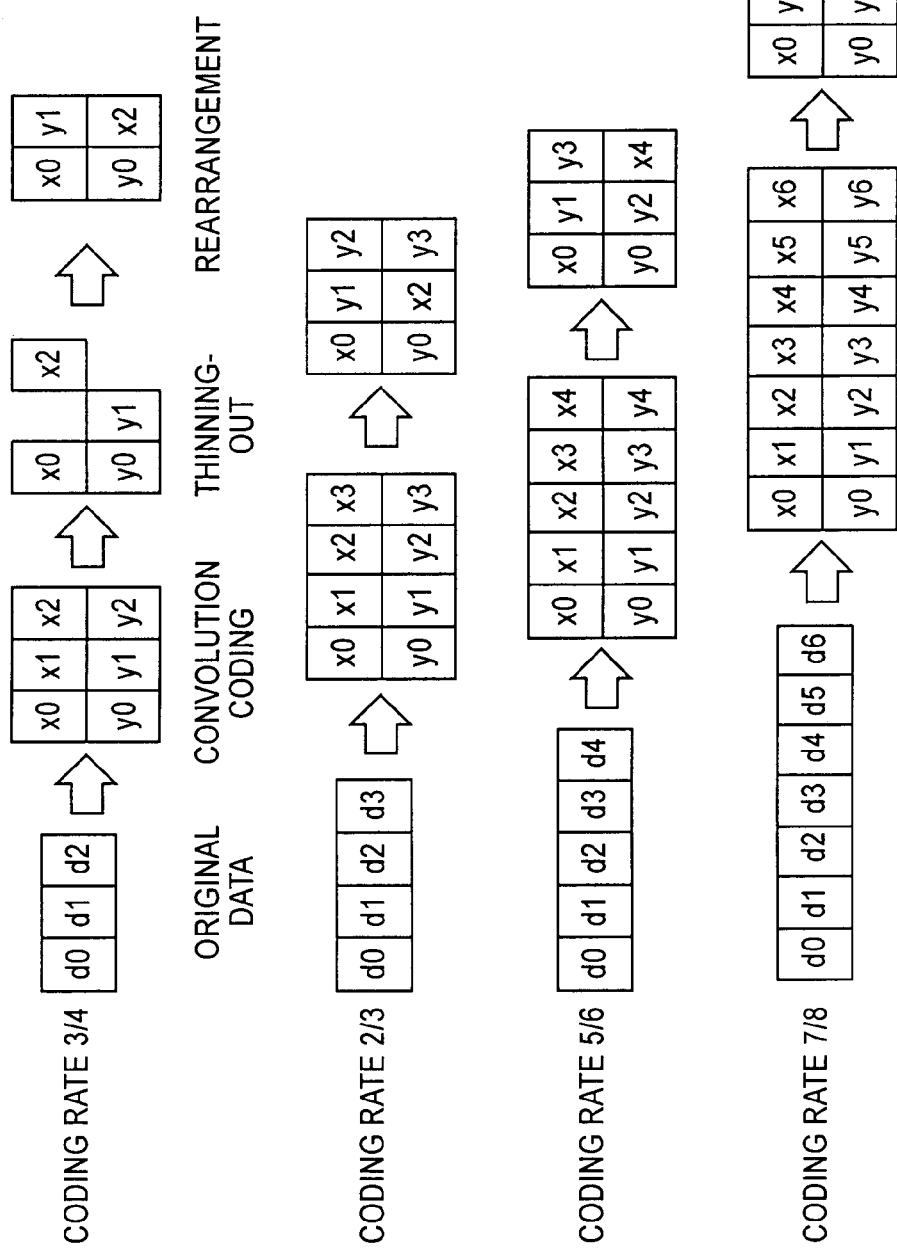
FIG. 3 is an explanatory diagram showing an example of a coding rate obtained by puncturing in the conventional transmitter.
Figure 4:
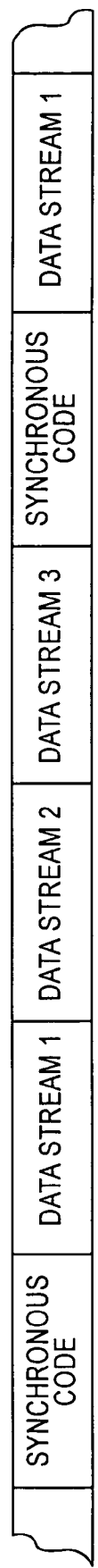
FIG. 4 is an explanatory diagram showing a structure of a data stream output from a conventional coder.
Figure 5:
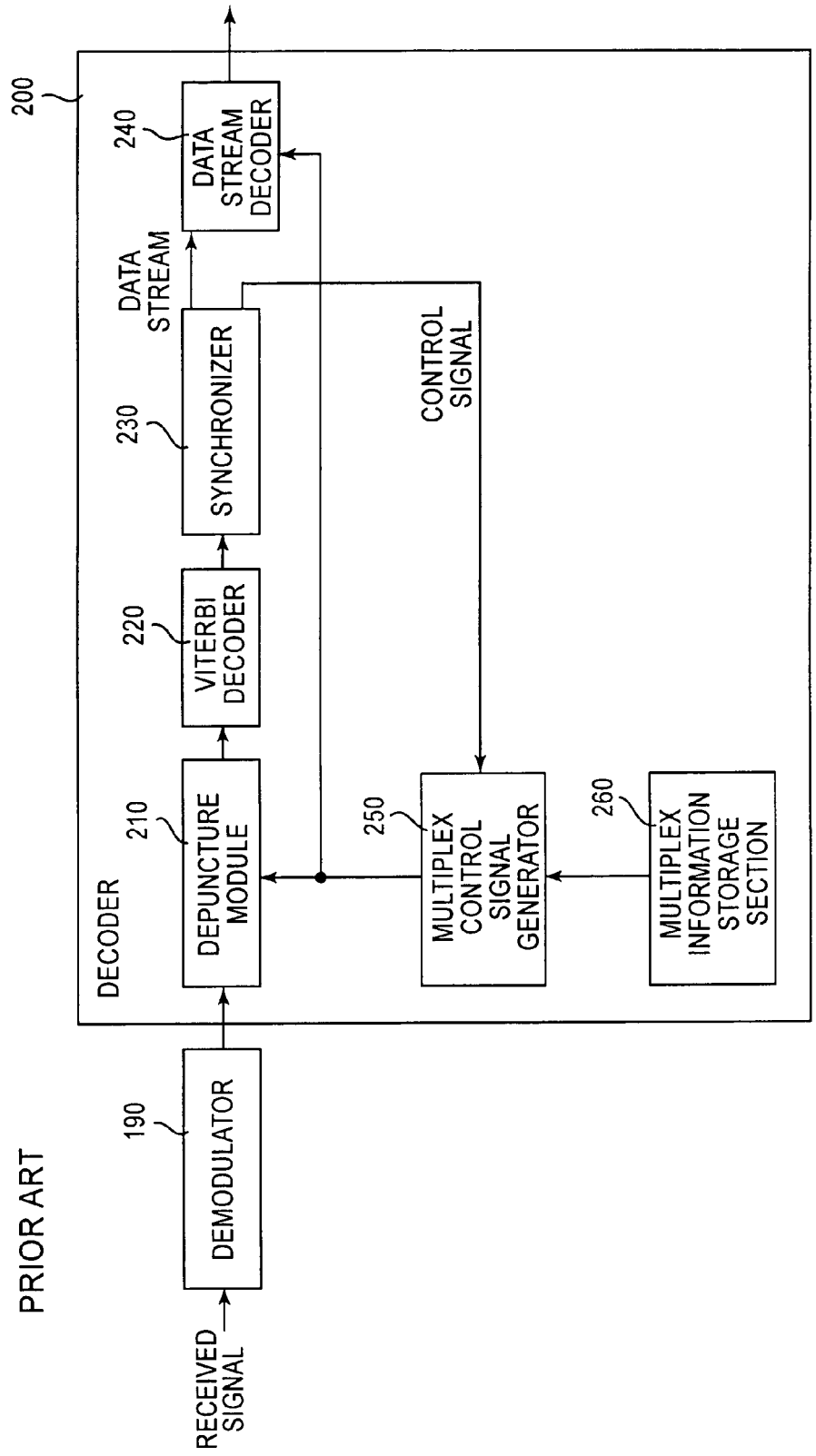
FIG. 5 is a block diagram showing a schematic structure of a conventional receiver.

The legends same as in FIG. 5 are provided to the other components which are common to those of the conventional decoder 200, and the explanation thereof is omitted. The Viterbi decoder 220 initializes an internal Hamming distance storage device according to an external signal.

Operation of the decoder 10 will be now explained. A signal output from the demodulator 190 or the like shown in FIG. 5 is input into the depuncture module 210 and the signal-to-noise ratio monitor 12. The signal-to-noise ratio monitor 12 measures noise strength of BER (Bit Error Rate) or the like with predetermined time intervals from the input signal so as to output the measured result as a measurement signal. The measurement signal output from the signal-to-noise ratio monitor 12 is input into the comparator 14 so as to be judged as to whether or not a noise is allowable.

It is assumed that a value which represents an upper limit of the allowable noise has been previously set in the comparator 14. When the value of the measurement signal exceeds this set value, a low-level pulse signal is output as a post signal, for example. Moreover, when the value of the measurement signal does not exceed the set value, a signal in a high-level state is output.

Meanwhile, the signal input into the decoder 10 is input into the depuncture module 210, the Viterbi decoder 220, the synchronizer 230 and the data stream decoder 240 successively so as to undergo the decoding processes. A control signal generated by the synchronizer 230 is fed back to the multiplex control signal generator 250. The control signal is used for taking timing of a multiplex control signal which decodes respective data streams according to multiplex information in the depuncture module 210 and the data stream decoder 240.

The multiplex control signal generator 250 receives the post signal output from the comparator 14 thereinto. When the post signal represents the state that the value exceeds the set value, namely, a big noise is mixed in the received signal, the initialization signal is output at timing based on the control signal output from the synchronizer 230, namely, timing that decoding of the respective data streams is started.

The initialization signal is input into the Viterbi decoder 220. The Viterbi decoder 220 initializes Hamming distances which have been calculated and stored, namely, path metrics according to the input of the initialization signal. As a result, an influence of the superposed noise in the decoding of the code string in the previous position can be avoided.

There arises a problem here that reliability of the maximum judgment of Viterbi decoding is lowered at the first stage of the data stream because the path metric is initialized. However, in the state that a noise of not less than certain strength is mixed in the received signal, it was confirmed by an experiment conducted by the inventors that more accurate decoding can be executed by such initialization process. Therefore, it is necessary to set the set value in the comparator 14 as a threshold value as to whether or not an effect is produced when the initializing process is carried out.

Figure 8:
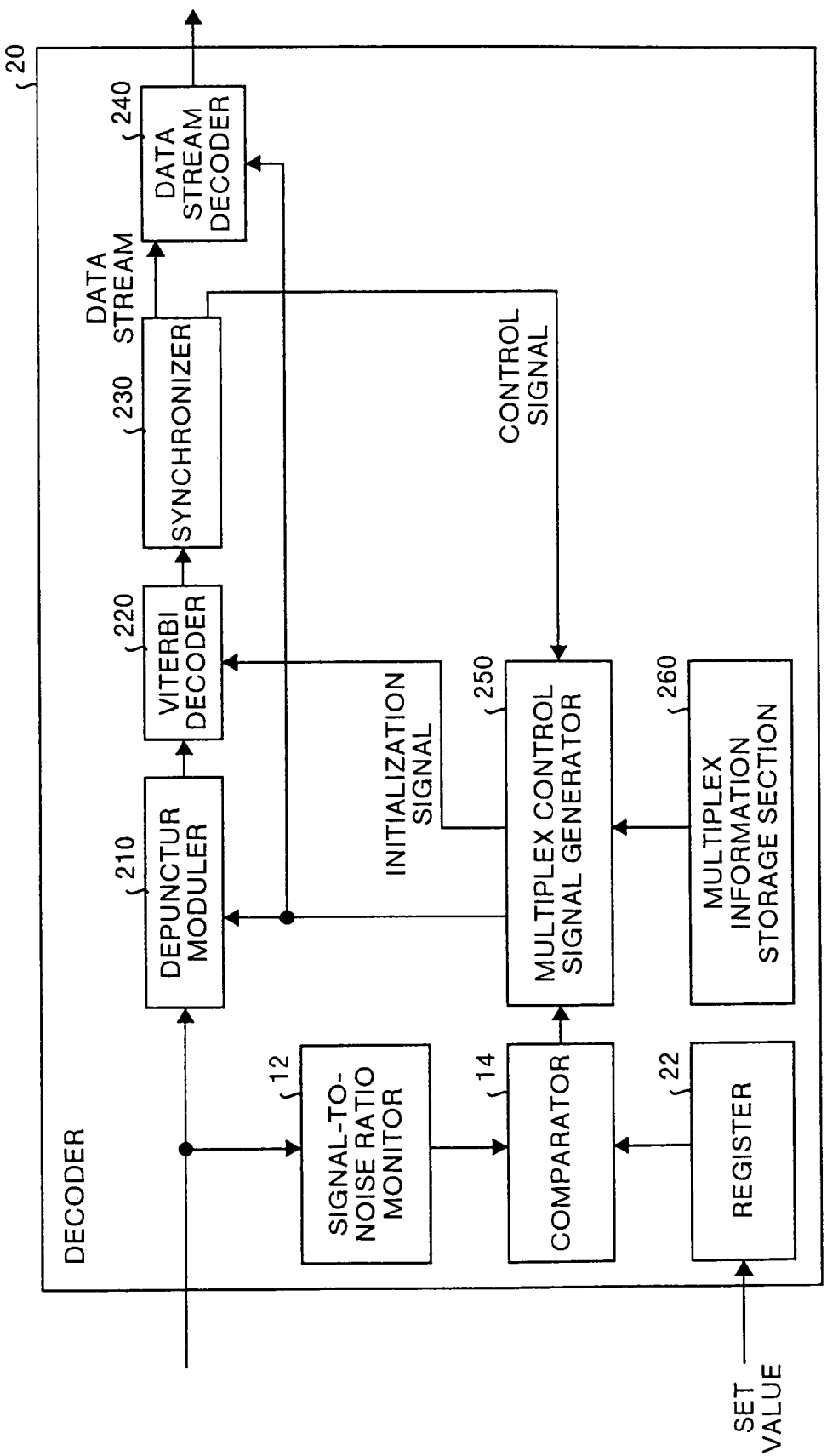
FIG. 8 is a block diagram showing another schematic structure of the decoder according to the first embodiment.

The set value in the comparator 14 can be changed with an external signal by providing a register. FIG. 8 is a diagram showing a schematic structure in the case where the register is provided in the decoder according to the first embodiment. The register 22 stores and holds the set value. The comparator 14 refers to the set value stored in the register 22 so as to be capable of changing the post signal to be input into the multiplex control signal generator 250, namely, an initializing condition according to the a condition of the transmission line and a code to be received.

In the decoders 10 and 20, the signal-to-noise ratio monitor 12 may measure noise strength for a modulated signal output from the modulator, not shown. Further, the signal-to-noise ratio monitor 12 may measure noise strength for a received signal to be input into the demodulator.

Further, an initialization signal generator may be provided instead of the multiplex control signal generator 250 to generate the initialization signal.

The decoding method and the decoder according to the first embodiment measures the strength of noise mixed in the received signal in the transmission system which transmits and receives data composed of multiplexed data stream. When the noise has a value which is equal to or greater than the predetermined set value, the initialization signal representing the initialization of the path metric is input into the Viterbi decoder 220 at a predetermined timing. For this reason, the decoded result with high reliability can be obtained in comparison with the decoded result obtained in the case where a comparatively big noise is mixed in the received signal.

Particularly according to the decoding method and the decoder of the first embodiment, in the case where a noise that error cannot be corrected sufficiently at the low coding rate is generated, secure decoding with originally high error correction ability can be executed in the data stream having the high coding rate without being influenced by the noise.

A decoding method and a decoder according to a second embodiment will be now explained. The decoding method and the decoder according to the second embodiment have the following characteristic in addition to the characteristic of the decoder 20 according to the first embodiment. Precisely, the initialization signal is input into the Viterbi decoder 220 only at a point that the data stream having coding rate of low error correction ability is changed into the data stream having coding rate of high error correction ability.

Figure 9:
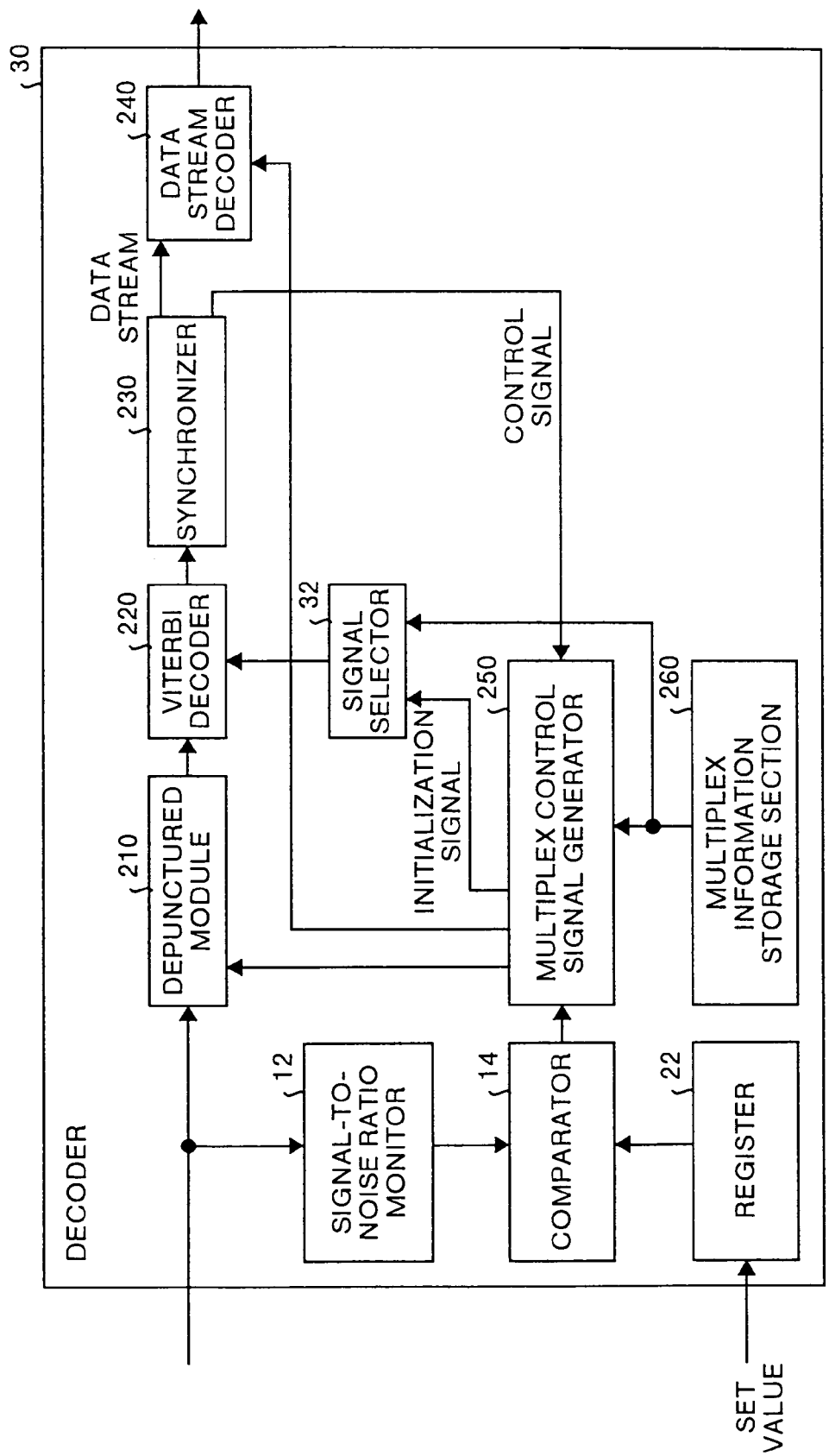
FIG. 9 is a block diagram showing a schematic structure of the decoder according to a second embodiment.

FIG. 9 is a block diagram showing a schematic structure of the decoder according to the second embodiment. The decoder 30 is provided with a signal selector 32. The signal selector 32 outputs the initialization signal to the Viterbi decoder 220 based on the multiplex information stored in the multiplex information storage section 260. The presence and absence of this signal selector 32 is the difference between the decoder 20 shown in FIG. 8 and the decoder 30. Legends same as in FIG. 8 are provided to the other components which are common to those of the decoder 20 according to the first embodiment, and the explanation thereof is omitted.

Operation of the decoder 30 will be explained below by taking into consideration only the differences with respect to the first embodiment. In FIG. 9, it is assumed that a post signal which represents that the noise exceeds the set value is output by the comparator 14 to the multiplex control signal generator 250. The multiplex control signal generator 250 outputs the initialization signal at a timing of the control signal output by the synchronizer 230. The initialization signal is input into the signal selector 32. The signal selector 32 also receives the multiplex information stored in the multiplex information storage section 260. The signal selector 32 then judges as to the timing that the initialization signal is input shows a point that which data stream is changed into which data stream.

Particularly, when the signal selector 32 judges that the timing that the initialization signal is input is the point that the data stream having coding rate of low error correction ability is changed into the data stream having coding rate of high error correction ability, only then the initialization signal is allowed to pass to the Viterbi decoder 220.

In the decoding of the data stream having coding rate of high error correction ability, an error can be corrected sufficiently even in a signal into which a comparatively big noise is mixed. As a result, coding of the next data stream having coding rate of low error correction ability is not influenced. On the contrary, if the initialization is executed at this change point, the decoding characteristic is deteriorated.

The signal selector 32 is provided so as to prohibit the Viterbi decoder 220 from being initialized at the point that the data stream having coding rate of high error correction ability is changed into the data stream having coding rate of low error correction ability.

The decoding method and the decoder according to the second embodiment initialize the Viterbi decoder 220 in the transmission system which transmits and receives data composed of multiplexed data stream at the point that the strength of noise mixed in the received signal exceeds the predetermined value and the data stream having coding rate of low error correction ability is changed into the data stream having coding rate of high error correction ability. As a result, the coded result with high reliability which is not much influenced by the noise can be obtained.

A decoding method and a decoder according to a third embodiment will be now explained. The decoding method and the decoder according to the third embodiment have the following characteristic in addition to the characteristic of the decoder 30 according to the second embodiment. Precisely, a plurality of multiplexed data stream are extracted from the data stream decoded by the data stream decoder 240 so as to be distributed.

Figure 10:
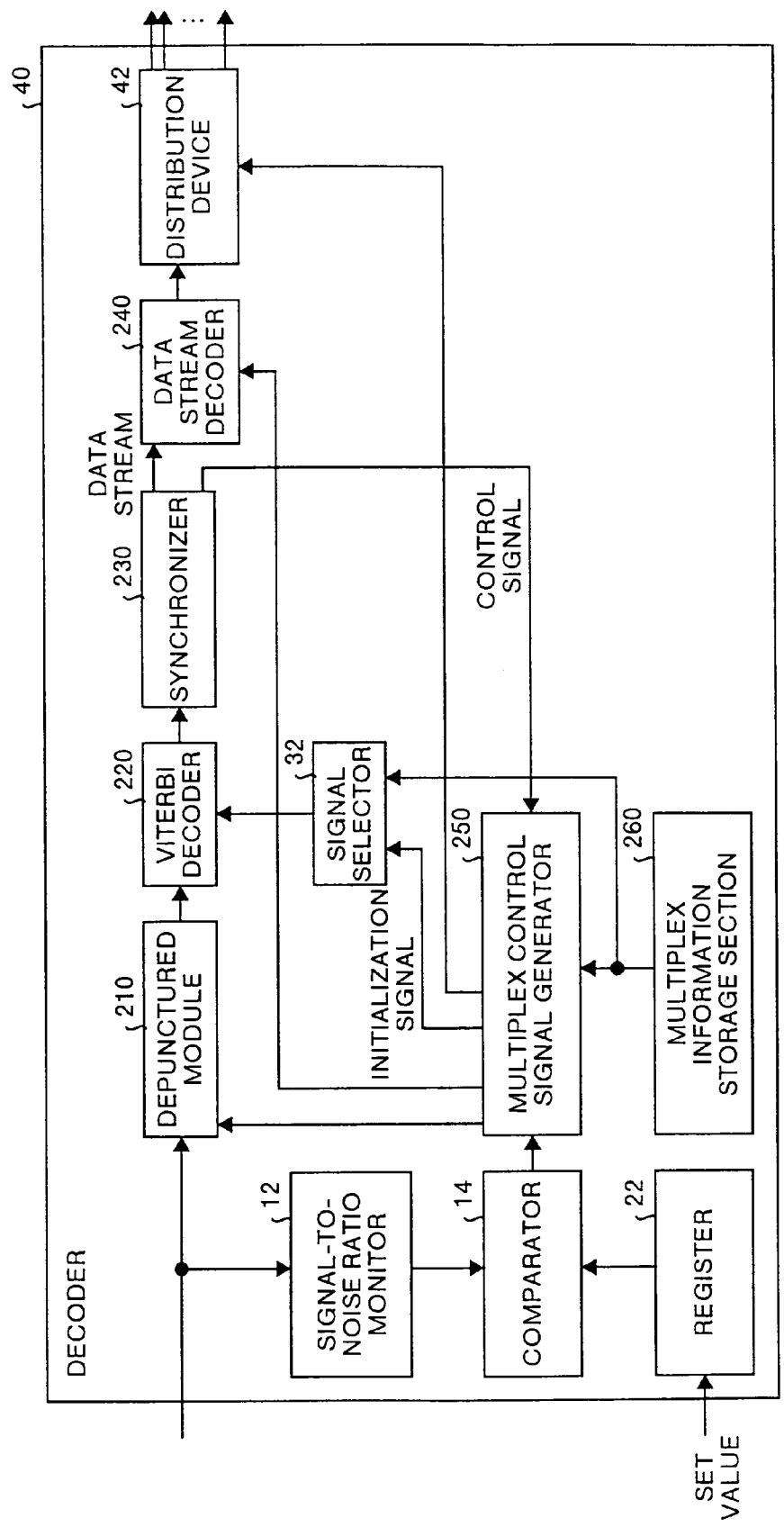
FIG. 10 is a block diagram showing a schematic structure of the decoder according to a third embodiment.

FIG. 10 is a block diagram showing a schematic structure of the decoder according to the third embodiment. This decoder 40 is provided with a distribution device 42, which distributes the plurality of data stream composing the data stream, at the later stage of the data stream decoder 240. This point is different from the decoder 30 shown in FIG. 9. Legends same as in FIG. 9 are provided to the other components which are common to those of the decoder 30 according to the second embodiment, and the explanation thereof is omitted. The multiplex control signal generator 250, in addition to other functions, generates a signal representing distribution timing of the data streams by means of the distribution device 42.

The multiplexed data streams are selected from the data stream decoded by the data stream decoder 240 so as to be distributed in the apparatus to which the decoders 10, 20 and 30 are connected. In this case, this apparatus to which the decoders are connected has to hold multiplex information and generate a multiplex control signal by means of the circuit configuration corresponding to the multiplex control signal generator 250 and the multiplex information storage section 260.

The distribution device 42 is provided at the later stage of the data stream decoder 240 in the decoder 40 so that the circuit configuration of the whole receiver equipped with this decoder 40 can be simplified. Signals which change punctured codes and the like already exist in the multiplex control signal generator 250 or the like in the decoder 40. Therefore, it is easy to generate a signal which distributes information.

The decoding method and the decoder according to the third embodiment initialize the Viterbi decoder 220 in the transmission system which transmits and receives data composed of multiplexed data stream at the point that the strength of noise mixed in the received signal exceeds the predetermined value and the data stream having coding rate of low error correction ability is changed into the data stream having coding rate of high error correction ability. Further, the distribution device 42 which distributes multiplexed data streams is provided at the later stage of the data stream decoder 240. As a result, the effect of the second embodiment can be produced, and the circuit configuration of the whole receiver equipped with the decoder 40 can be simplified.

A decoding method and a decoder according to a fourth embodiment will be now explained. In the decoders 10, 20, 30 and 40 according to the first to third embodiments, the multiplex information is known in the receiving side and is previously stored in the multiplex information storage section 260. However, the decoding method and the decoder according to the fourth embodiment is characterized in that the multiplex information is included in the transmission signal transmitted from the transmitter and the decoding process is executed dynamically upon receiving the multiplex information.

Figure 11:
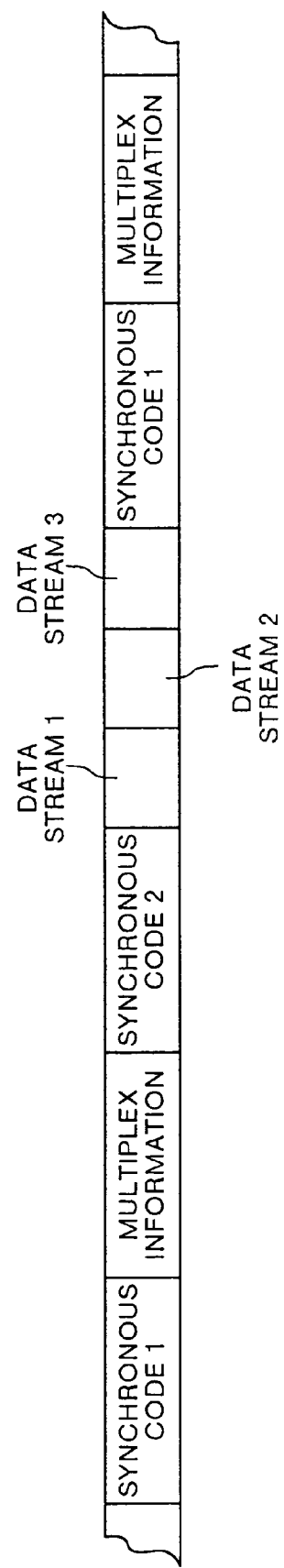
FIG. 11 is an explanatory diagram showing a structure of a data stream which is decoded in the decoder according to a fourth embodiment.

FIG. 11 is an explanatory diagram showing a structure of the data stream which is decoded by the decoder according to the fourth embodiment. As shown in FIG. 11, as for the signal which is input into the decoder according to the fourth embodiment via the demodulator, not shown, the multiplex information detected by a synchronous code 1 and the multiplexed data streams 1 to 3 detected by a synchronous code 2 are arranged in one frame, for example.

Figure 12:
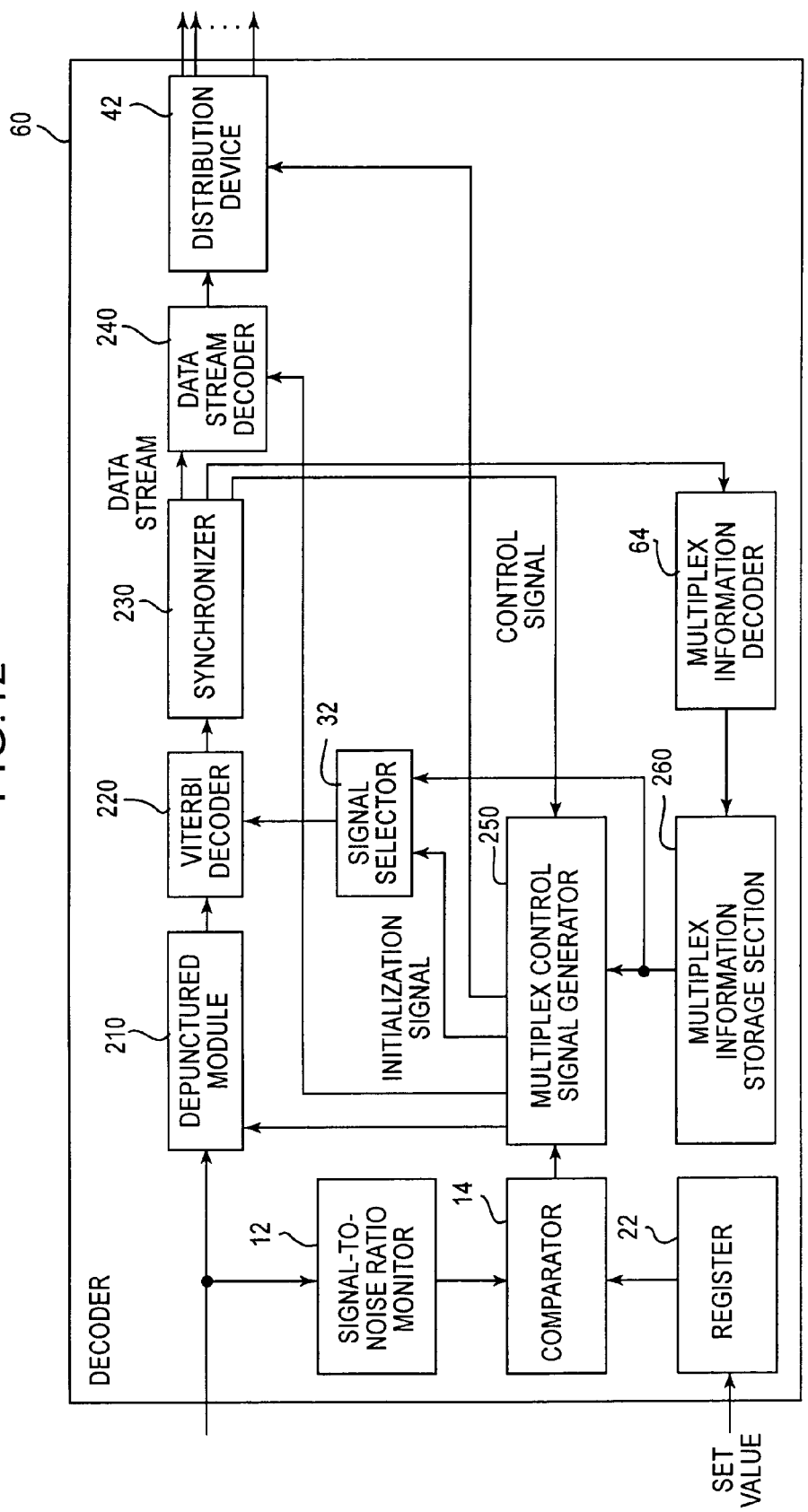
FIG. 12 is a block diagram showing a schematic structure of the decoder according to the fourth embodiment.

FIG. 12 is a block diagram showing a schematic structure of the decoder according to the fourth embodiment. This decoder 60 is provided with a multiplex information decoder 64 which decodes the multiplex information. This is different from the decoder 40 shown in FIG. 10. Legends same as in FIG. 10 are provided to the other components which are common to the decoder 40 according to the third embodiment, and the explanation thereof is omitted. The multiplex information storage section 260 receives a signal which represents the multiplex information output from the multiplex information decoder 64 so as to rewrite the multiplex information to be stored based on the input signal.

Operations of the decoder 60 which are different from those in the third embodiment will only be explained here. A plurality of information source data are coded by a system composed of the Reed-Solomon coding circuit, the frame structure circuit, the energy dispersion circuit and the interleaver in the multiplexer 110 of the coder 100. Moreover, the multiplex information is coded by the Reed-Solomon coding circuit and the energy dispersion circuit, and a synchronous code is added to the information source data and the multiplex information and they are multiplex. As a result, the data stream output from the coder of the transmitter is obtained.

Figure 6:
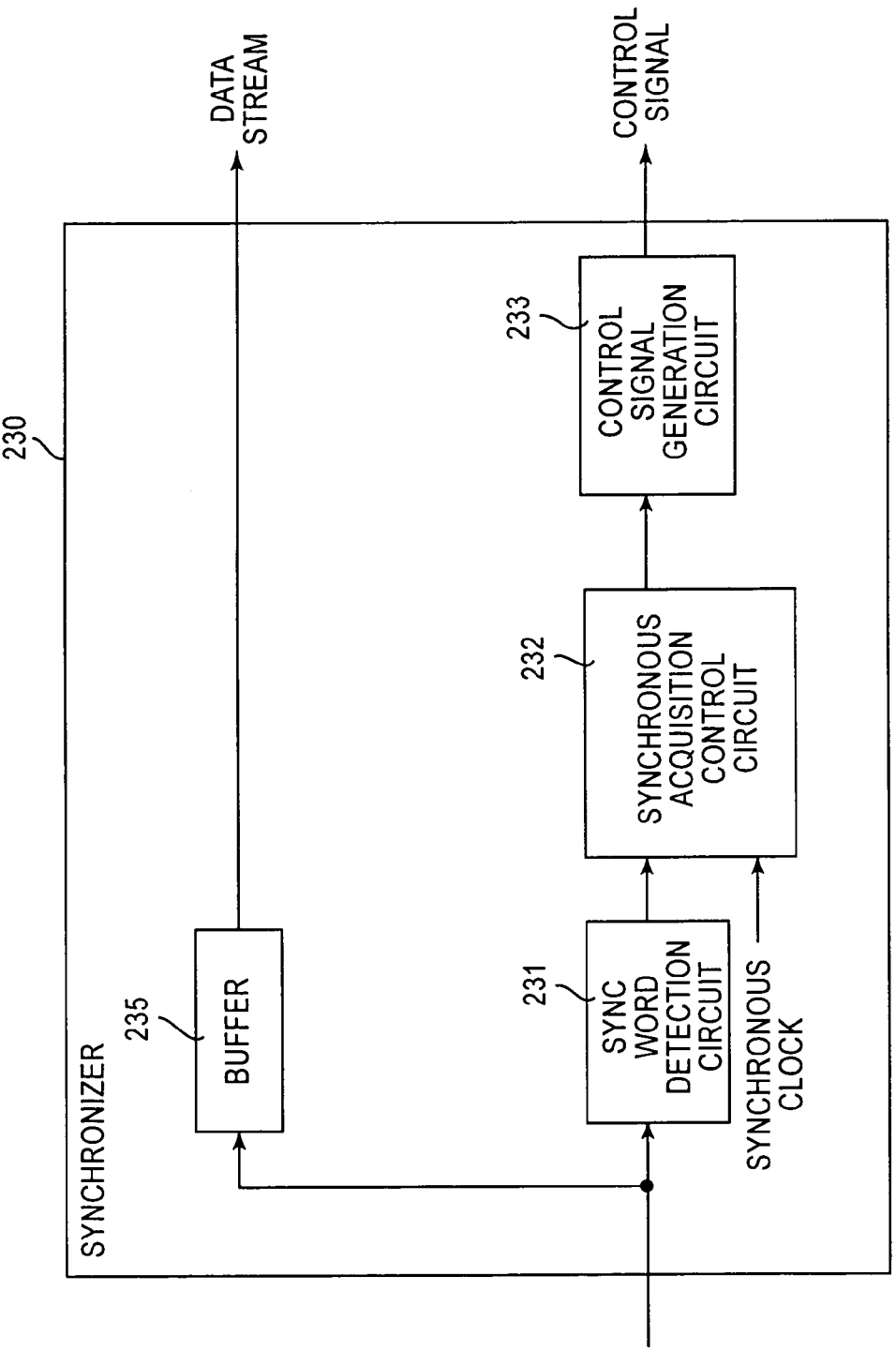
FIG. 6 is a block diagram showing a schematic structure of a synchronizer in the conventional receiver.

The synchronizer 62, in the same manner as shown in FIG. 6, generates a control signal to be input into the multiplex control signal generator 250. Moreover, the synchronizer 62 extracts the data stream and the data stream representing the multiplex information from the input signal.

The data stream extracted in the synchronizer 62 is input into the data stream decoder 240 so as to undergo the decoding process. Meanwhile, the data stream representing the multiplex information in the synchronizer 62 is input into the multiplex information decoder 64. Although not shown in this figure, the multiplex information decoder 64 is composed of an energy dispersion signal removal circuit and a Reed-Solomon code error correcting circuit. The multiplex information decoder 64 decodes the multiplex information from the input data stream.

The multiplex information decoded in the multiplex information decoder 64 is input as a multiplex information signal into the multiplex information storage section 260. The multiplex information storage section 260 updates the stored multiplex information into multiplex information represented by this multiplex information signal. The multiplex information stored in the multiplex information storage section 260 is referred to by the multiplex control signal generator 250.

The decoding method and the decoder according to the fourth embodiment initialize the Viterbi decoder 220 in the transmission system which transmits and receives data composed of multiplexed data stream at the point that the strength of noise mixed in the received signal exceeds the predetermined value and the data stream having coding rate of low error correction ability is changed into the data stream having coding rate of high error correction ability. Further, the multiplex data stream is distributed, and in the case where the multiplex information is included in the received signal, the multiplex information is decoded so that the decoding form of the respective multiplexed data streams can be changed dynamically. As a result, in the case where the transmission signal where the multiplex form is changed is decoded, the effect of the third embodiment can be produced.

As explained above, according to the present invention, when the signal-to-noise ratio monitor detects that the noise exceeds a predetermined value, only then the path metric of the Viterbi decoder is initialized. For this reason, only in the case where a noise where an initializing effect can be obtained even after adding deterioration of the decoding characteristic due to the initialization occurs, the initialization is possible. As a result, the optimal decoding with high stability and reliability can be executed in comparison with the decoding which is executed in the case where a comparatively big noise is mixed in the received signal.

Furthermore, when the timing that the initialization signal is input is the point that the data stream having coding rate of low error correction ability is changed into the data stream having coding rate of high error correction ability, only then the Viterbi decoder is initialized. For this reason, the calculated result of the path metric calculated by decoding the data stream having coding rate of high error correction ability can be utilized when the next data stream having coding rate of low error correction ability is decoded. As a result, the high-reliable decoded result which is not much influenced by noise can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of decoding time division multiplexed data including a plurality of data streams convolutionally encoded with different coding rates and modulated using any one of BPSK, QPSK, and 8PSK , the method comprising:
    decoding, using a Viterbi decoding algorithm, a first data stream that is included in the time division multiplexed data and modulated using any one of 8PSK and QPSK;
    decoding, using the Viterbi decoding algorithm, a second data stream that is included in the time division multiplexed data and modulated using any one of QPSK or BPSK; and
    initializing, after completion of the decoding of the first data stream and before performing the decoding of the second data stream, a path metric that has been calculated before the completion of the decoding of the first data stream, except when both the first data stream and the second data stream are modulated using QPSK.

2. The method according to claim 1, wherein the path metric is initialized when a coding rate of the second data stream is larger than a coding rate of the first data stream.

3. The method according to claim 1, further comprising:
    measuring a strength of a noise included in the time division multiplexed data; and
    checking whether the strength is equal to or greater than a predetermined value, wherein
    the path metric is initialized at the initializing when the strength is equal to or greater than a predetermined value.

4. The method according to claim 1, wherein the first data stream has a coding rate of low error correction ability, and the second data stream has a coding rate of high error correction ability.

5. A data receiving system comprising:
    a Viterbi decoder that decodes time division multiplexed data including a plurality of data streams convolutionally encoded with different coding rates and modulated using any one of BPSK, QPSK, and 8PSK ; and
    an initialization signal generation unit that outputs an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both the first data stream and the second data stream are modulated using QPSK.

6. The data receiving system according to claim 5, further comprising a signal selection, unit that receives the initialization signal from the initialization signal generation unit, checks whether a coding rate of the second data stream is larger than a coding rate of the first data stream, and provides the initialization signal to the Viterbi decoder when the coding rate of the second data stream is larger than the coding rate of the first data stream.

7. The data receiving system according to claim 5, further comprising a distribution unit that divides the time division multiplexed data decoded by the Viterbi decoder into a plurality of information corresponding to the plurality of data streams.

8. The data receiving system according to claim 5, further comprising a multiplexed information decoding unit that extracts and decodes multiplexed information included in the time division multiplexed data.

9. The data receiving system according to claim 5, further comprising:
    a signal-to-noise ratio monitor that measures a strength of a noise included in the time division multiplexed data; and
    a comparison unit that checks whether the strength is equal to or greater than a predetermined value and outputs a notification signal to the initialization signal generation unit when the strength is equal to or greater than the predetermined value, wherein
    the initialization signal generation unit outputs the initialization signal upon receiving the notification signal from the comparison unit.

10. The data receiving system according to claim 9, further comprising a register that stores therein the predetermined value.

11. The data receiving system according to claim 5, wherein the first data stream has a coding rate of low error correction ability, and the second data stream has a coding rate of a high error correction ability.

12. A decoder comprising:
    a Viterbi decoder that decodes time division multiplexed data including a plurality of data streams convolutionally encoded with different coding rates and modulated using any one of BPSK, QPSK, and 8PSK ; and
    an initialization signal generation unit that outputs an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both of the first data stream and the second data stream are modulated using QPSK.

13. The decoder according to claim 12, further comprising:
    a signal-to-noise ratio monitor that measures a strength of a noise included in the time division multiplexed data; and
    a comparison unit that checks whether the strength is equal to or greater than a predetermined value and outputs a notification signal to the initialization signal generation unit when the strength is equal to or greater than the predetermined value, wherein the initialization signal generation unit outputs the initialization signal upon receiving the notification signal from the comparison unit.

14. The decoder according to claim 12, wherein the first data stream has a coding rate of low error correction ability, and the second data stream has a coding rate of high error correction ability.

15. A data transmitting and receiving system comprising:
a transmitting unit that transmits time division multiplexed data including a plurality of data streams convolutionally encoded with different coding rates and modulated using any one of BPSK, QPSK, and 8PSK ; and
a receiving unit that receives and decodes the time division multiplexed data and includes:
a Viterbi decoder that decodes the time division multiplexed data;
a signal-to-noise ratio monitor that detects a strength of a noise included in the time division multiplexed data; and
an initialization signal generating unit that outputs, based on the strength of the noise, an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both of the first data stream and the second data stream are modulated using QPSK.

16. The data transmitting and receiving system according to claim 15, wherein the initialization signal is output to the Viterbi decoder when a coding rate of the second data stream is larger than a coding rate of the first data stream.

17. A method of decoding time division multiplexed data including a plurality of data streams convolutionally encoded and modulated using any one of BPSK, QPSK, and 8PSK the method comprising:
decoding, using a Viterbi decoding algorithm, a first data stream that is included in the time division multiplexed data and modulated using any one of 8PSK and QPSK;
decoding, using the Viterbi decoding algorithm, a second data stream that is included in the time division multiplexed data and modulated using any one of QPSK and BPSK; and
initializing after completion of the decoding of the first data stream and before performing the decoding of the second data stream, a path metric that has been calculated before the completion of the decoding of the first data stream, except when both of the first data stream and the second data stream are modulated using QPSK.

18. The method according to claim 17, further comprising:
measuring a strength of a noise included in the time division multiplexed data; and
checking whether the strength is equal to or greater than a predetermined value, wherein
the path metric is initialized at the initializing when the strength is equal to or greater than a predetermined value.

19. The method according to claim 17, wherein the first data stream has a coding rate of low error correction ability, and the second data stream has a coding rate of high error correction ability.

20. A data receiving system comprising:
a Viterbi decoder that decodes time division multiplexed data including a synchronous code, multiplex information, and a plurality of data streams convolutionally encoded with different coding rates and modulated using any one of BPSK, QPSK, and 8PSK ; and
an initialization signal generation unit that outputs an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both of the first data stream and the second data stream are modulated using QPSK.

21. The data receiving system according to claim 20, further comprising a synchronizer that outputs a control signal to the initialization signal generation unit upon detecting the synchronous code.

22. The data receiving system according to claim 20, further comprising:
a signal-to-noise ratio monitor that measures a strength of a noise included in the time division multiplexed data; and
a comparison unit that checks whether the strength is equal to or greater than a predetermined value and outputs a notification signal to the initialization signal generation unit when the strength is equal to or greater than the predetermined value, wherein
the initialization signal generation unit outputs the initialization signal upon receiving the notification signal from the comparison unit.

23. The data receiving system according to claim 20, wherein the first data stream has a coding rate of low error correction ability, and the second data stream has a coding rate of high error correction ability.

24. A data transmitting and receiving system comprising:
a transmitting unit that transmits time division multiplexed data including a plurality of data streams convolutionally encoded with different coding rates and modulated using any one of BPSK, QPSK, and 8PSK; and
a receiving unit that receives and decodes the time division multiplexed data and includes,
a Viterbi decoder which that decodes the time division multiplexed data; and
an initialization signal generation unit that outputs an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both of the first data stream and the second data stream are modulated using QPSK.

25. The data transmitting and receiving system according to claim 24, further comprising:
a signal-to-noise ratio monitor that measures a strength of a noise included in the time division multiplexed data; and a comparison unit that checks whether the strength is equal to or greater than a predetermined value and outputs a notification signal to the initialization signal generation unit when the strength is equal to or greater than the predetermined value, wherein the initialization signal generation unit outputs the initialization signal upon receiving the notification signal from the comparison unit.

26. A decoder comprising:

a Viterbi decoder that decodes time division multiplexed data including a synchronous code, multiplex information, and a plurality of data streams convolutionally encoded with different coding rates and modulated using any one of BPSK, QPSK, and 8PSK ; and an initialization signal generation unit that outputs an initialization signal for a path metric to the Viterbi decoder after completion of decoding of a first data stream, which is included in the time division multiplexed data and modulated using any one of 8PSK and QPSK, and before performing decoding of a second data stream, which is included in the time division multiplexed data and modulated using any one of QPSK and BPSK, except when both of the first data stream and the second data stream are modulated using QPSK.

27. The data decoder according to claim 26, further comprising a synchronizer that outputs a control signal to the initialization signal generation unit upon detecting the synchronous code.

28. The decoder according to claim 26, further comprising:

a signal-to-noise ratio monitor that measures a strength of a noise included in the time division multiplexed data; and a comparison unit that checks whether the strength is equal to or greater than a predetermined value and outputs a notification signal to the initialization signal generation unit when is equal to or greater than the predetermined value, wherein the initialization signal generation unit outputs the initialization signal upon receiving the notification signal from the comparison unit.

29. The decoder according to claim 26, wherein the first data stream has a coding rate of a low error correction ability, and the second data stream has a coding rate of high error correction ability.

* * * * *